(12) United States Patent
Mei

(10) Patent No.: US 6,265,234 B1
(45) Date of Patent: Jul. 24, 2001

(54) ALIGNMENT SYSTEM FOR A SPHERICAL DEVICE

(75) Inventor: Wenhui Mei, Richardson, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/490,499

(22) Filed: Jan. 25, 2000

(51) Int. Cl.⁷ .................................................. H01L 21/66
(52) U.S. Cl. .............................................. 438/14; 257/618
(58) Field of Search ..................... 438/14, 401; 257/618; 118/60, 62

(56) References Cited

U.S. PATENT DOCUMENTS

| 4,239,332 | 12/1980 | Inbar | 385/22 |
|---|---|---|---|
| 4,635,373 | 1/1987 | Miyazaki et al. | 33/573 |
| 5,092,204 | * 3/1992 | Labriola | 81/484 |
| 5,456,018 | 10/1995 | Irlbeck | 33/645 |
| 5,556,808 | 9/1996 | Williams et al. | 437/209 |
| 5,848,477 | 12/1998 | Wiedmann et al. | 33/503 |
| 5,955,776 | 9/1999 | Ishiakawa | 257/618 |
| 6,136,617 | * 10/2000 | Kanatake et al. | 438/14 |
| 6,178,654 | * 1/2001 | Kanatake | 33/645 |
| 6,203,658 | * 3/2001 | Ishikawa | 156/345 |

OTHER PUBLICATIONS

Application No. 09/066,222, filed Apr. 24, 1998, entitled: Touchless Stabilizer For Processing Spherical Shaped Devices by Ramesh Kasim and Ram Ramamurthi, copy of first page of specification, abstract and figure No. one (Attorney Docket No. 22397.65).

Application No. 09/350,634, filed Jul. 9, 1999, entitled: Alignment System for a Spherical Shaped Device by Takashi Kanatake and Hiroshi Kohizuka, copy of first page of specification, abstract and figure No. one (Attorney Docket No. 22397.97.02).

Application No. 09/252,139, filed Feb. 18, 1999, entitled: Method and System for Aligning Spherical–Shaped Objects by Takashi Kanatake, copy of first page of specification, abstract and Figure No. one (Attorney Docket No. 22397.104).

* cited by examiner

Primary Examiner—David Nelms
Assistant Examiner—Quoc Hoang
(74) Attorney, Agent, or Firm—Haynes and Boone LLP

(57) ABSTRACT

Method and apparatus are described for aligning a spherical-shaped semiconductor having an alignment mark, the device comprising a housing having a bore for receiving the spherical-shaped semiconductor; an optical sensing system and controller for ascertaining the position and orientation of the alignment mark; and rotatable vacuum rods for rotating the spherical-shaped semiconductor along at least two axes thereof, thereby rotating the alignment mark into a predetermined orientation.

31 Claims, 7 Drawing Sheets

ALIGNMENT SYSTEM FOR A SPHERICAL DEVICE

BACKGROUND

This disclosure relates generally to alignment systems for spherical-shaped objects, and more particularly, to an apparatus and method for manipulating and aligning spherical-shaped objects suitable for use in the manufacture and transport of spherical-shaped semiconductor integrated circuits.

Conventional integrated circuits, or "chips," normally require processing at multiple facilities, being manufactured as flat surface semiconductor wafers in a specialized manufacturing facility, and then transferred to a fabrication facility, where several layers are processed onto the wafer. The wafer is then cut into one or more chips and assembled into packages. The enormous effort and expense required for creating perfectly flat silicon wafers hampers the process of creating chips. High manufacturing costs make the chips expensive, for example, dust-free clean rooms and temperature-controlled manufacturing and storage areas are necessary to prevent the wafers and chips from warping. Moreover, the wafers typically have some defects in spite of all the precautions taken, due to the difficulty in making a large, single, highly pure crystal.

As the demand for smaller electronic devices continues, integrated circuits must become smaller, and the above-described wafer defects will become more significant. As such, alternatives to chips will play an increasingly important role in the future. For example, U.S. Pat. No. 5,955,776 discloses a method and apparatus for manufacturing a spherical-shaped semiconductor integrated circuit having many benefits over chips.

Spherical-shaped semiconductor fabrication includes a variety of processing steps, including deposition of films and photolithography, which require that the spherical-shaped semiconductor be correctly aligned. Alignment generally involves finding one or more alignment marks placed on a semiconductor before production, and then manipulating the semiconductor to align the mark correctly. This process is relatively simple with a chip, which only has two readily discernable sides.

However, because of its spherical shape, the alignment mark of the spherical-shaped semiconductor can be in any number of orientations at the end of the manufacture stage, requiring more sophisticated alignment considerations. Moreover, physically rotating a spherical-shaped semiconductor for alignment is fraught with difficulties. First, the spherical-shaped semiconductor has a very small diameter. Second, physically grasping the spherical-shaped semiconductor may result in significant damage. Third, the spherical shape of the spherical-shaped semiconductor typically conceals at least one-half of its surface area from an optical sensing system.

Therefore, what is needed is an apparatus and method capable of readily aligning small spherical-shaped objects.

SUMMARY

The present invention, accordingly, provides a method and apparatus for aligning a spherical-shaped semiconductor having an alignment mark, the device comprising a housing having a bore for receiving the spherical-shaped semiconductor; means for conveying the position and orientation of the alignment mark to a controller; and means for rotating the spherical-shaped semiconductor along at least two axes thereof, thereby rotating the alignment mark into a predetermined orientation.

One advantage of the embodiments described herein is that they are all capable of readily aligning small spherical-shaped objects. Another advantage of the embodiments described herein is that they impart rotation to the spherical-shaped semiconductor without damaging its surface.

DETAILED DESCRIPTION

Figure 1:
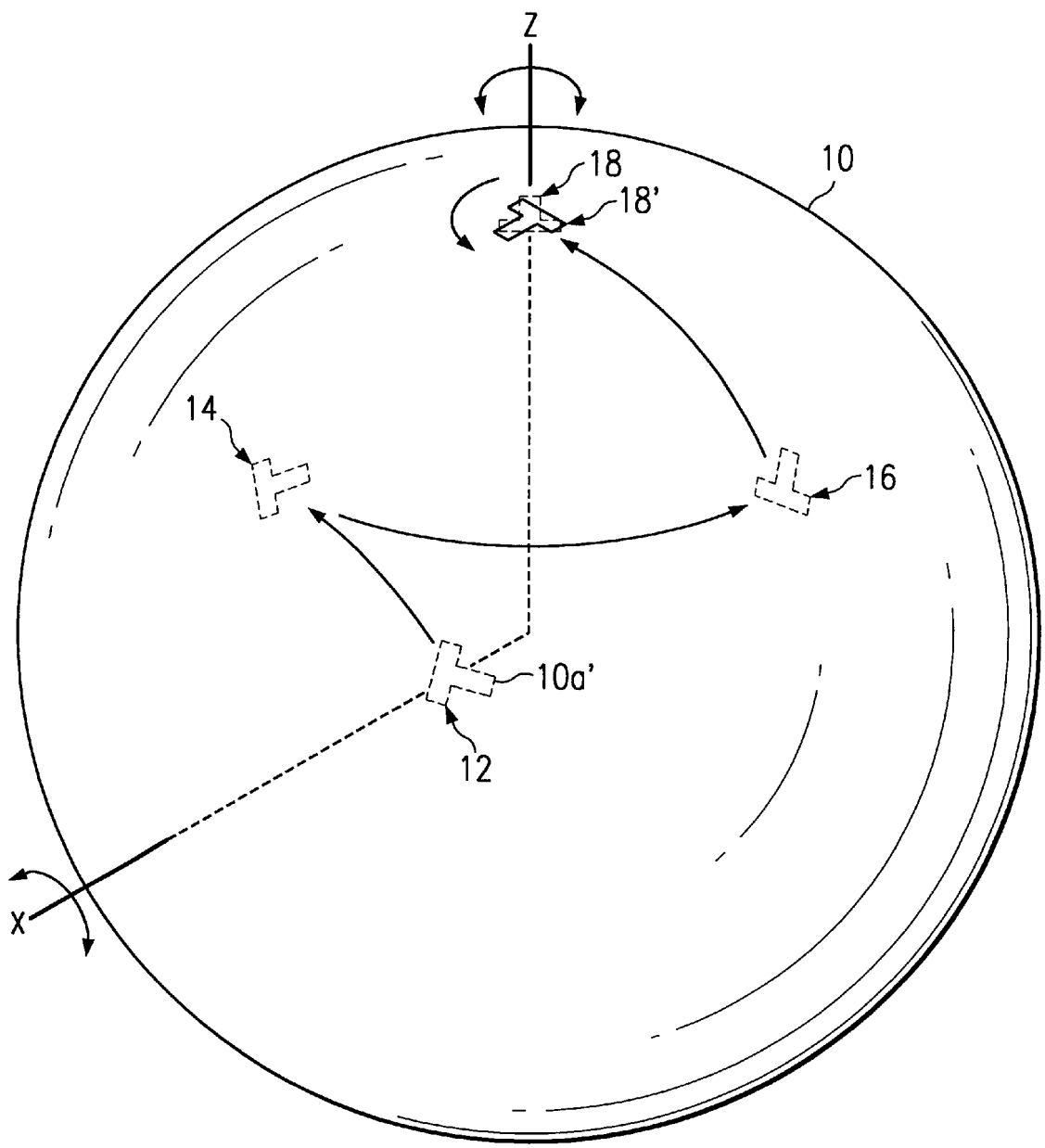
FIG. 1 depicts a schematic of a spherical-shaped semiconductor.

FIG. 1 depicts a schematic of the alignment of a spherical-shaped semiconductor 10 having a substantially "T"-shaped alignment mark 10a (although any nonsymmetrical shape, or series of shapes, that allows the mark to be perceived as in a specific orientation could be used as an alignment mark). It is understood that for the purposes of this specification, "spherical-shaped semiconductor" will be used to refer generally to the orb itself. Thus, spherical-shaped semiconductor encompasses both the article before and after any particular stage of the various manufacturing and processing steps.

The alignment mark 10a denotes both a position and an orientation, each of which must be considered during spherical-shaped semiconductor alignment, which involves physical rotation of the spherical-shaped semiconductor 10 around two axes. A first axis is represented by the reference letter Z. Rotation around the axis Z will produce equatorial rotation of the spherical-shaped semiconductor 10. Rotation around a second axis, which is positioned at a 90 degree angle relative to the Z axis, referred to by the reference letter X, will produce longitudinal rotation of the spherical-shaped semiconductor 10.

The alignment mark 10a has an initial position 12, which is determined by a controller. It is understood that the controller comprises software, an optical sensing system, and connectors, necessary to plot and control a rotational solution set for alignment of the spherical-shaped semiconductor. A series of rotations are required to move the alignment mark 10a to the desired position 18. One possible solution set comprises a left rotation along the X axis to a position 14, followed by a left rotation along the Z axis to a position 16, and a left rotation along the X axis to the desired position 18. Finally, a left rotation along the Z axis to an orientation 18' is required to place the mark in the desired orientation, while maintaining the position 18.

Figure 2:
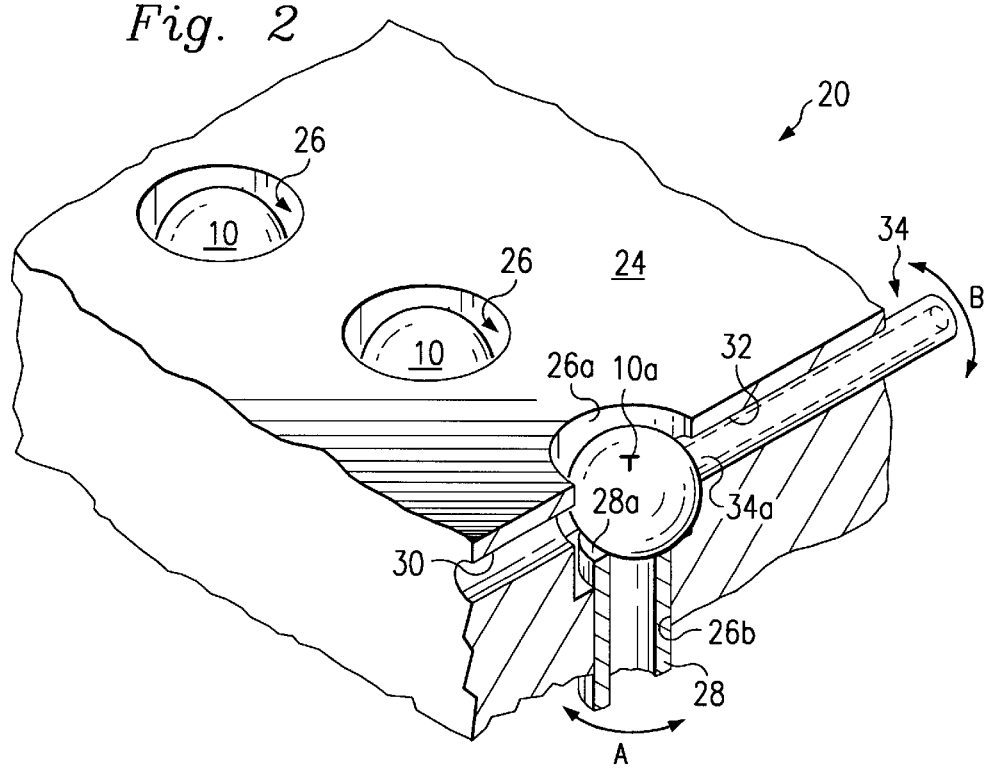
FIG. 2 illustrates an isometric view, with a cross section, of an apparatus for aligning a spherical-shaped semiconductor.

Referring to FIG. 2, the reference numeral 20 refers to an apparatus for aligning a spherical-shaped semiconductor 10 having an alignment mark 10a. It is understood that the apparatus 20 is part of an alignment system for aligning the spherical-shaped semiconductor 10 during the processing of spherical-shaped semiconductor integrated circuits.

The apparatus 20 has a housing 24, which may be formed of metal or other durable material. A plurality of bores 26 are formed in the housing 24 to accommodate a plurality of spherical-shaped semiconductors 10, each bore being stepped along its length to form sections: 26a and 26b. The housing bore section 26a has a larger diameter than the housing bore section 26b, and receives the spherical-shaped semiconductor 10 for alignment, as will be described.

A first cylindrical rod 28 is disposed in the section 26b of the housing bore in a manner to allow the rod to rotate about its longitudinal axis, as indicated by arrow A, when the rod is driven by an actuator (not shown). A first end 28a of the first rod 28 protrudes slightly into the section 26a for contacting the spherical-shaped semiconductor 10, as will be explained.

A cross bore 30 is formed in the housing 24, opening into the section 26a, for receiving a micro lens (not shown), thereby allowing observation of the spherical-shaped semiconductor 10, and more particularly of the alignment mark 10a, by the above-described controller.

A second cross bore 32 is formed in the housing 24 opposite the cross bore 30. The second bore 32 also opens into the housing section 26a, and receives a second cylindrical rod 34, which is perpendicular relative to the first rod 28. The rod 34 is disposed in the bore 32 in a manner to allow the rod to rotate about its longitudinal axis, as indicated by arrow B, when the rod is driven by an actuator (not shown). A first end 34a of the rod 34 protrudes slightly into section 26a adjacent to the spherical-shaped semiconductor 10.

In operation, separate vacuum producing devices (not shown) are connected to the rods 28 and 34, respectively, only one vacuum being selectively activated at a given time by the above-described controller. Decreased pressure produced by the selected vacuum is experienced through the selected hollow rod, the suction causing the spherical-shaped semiconductor 10 to be removably coupled to the selected rod end. If the selected rod's actuator is also activated, the selected rod imparts its rotation to the spherical-shaped semiconductor 10. For example, when the rod 28 is selected and activated, it rotates the spherical-shaped semiconductor 10 along an axis that is relatively equatorial. Likewise, when the selected (and activated) rod is the rod 34, it rotates the spherical-shaped semiconductor 10 along an axis that is relatively longitudinal.

Figure 3:
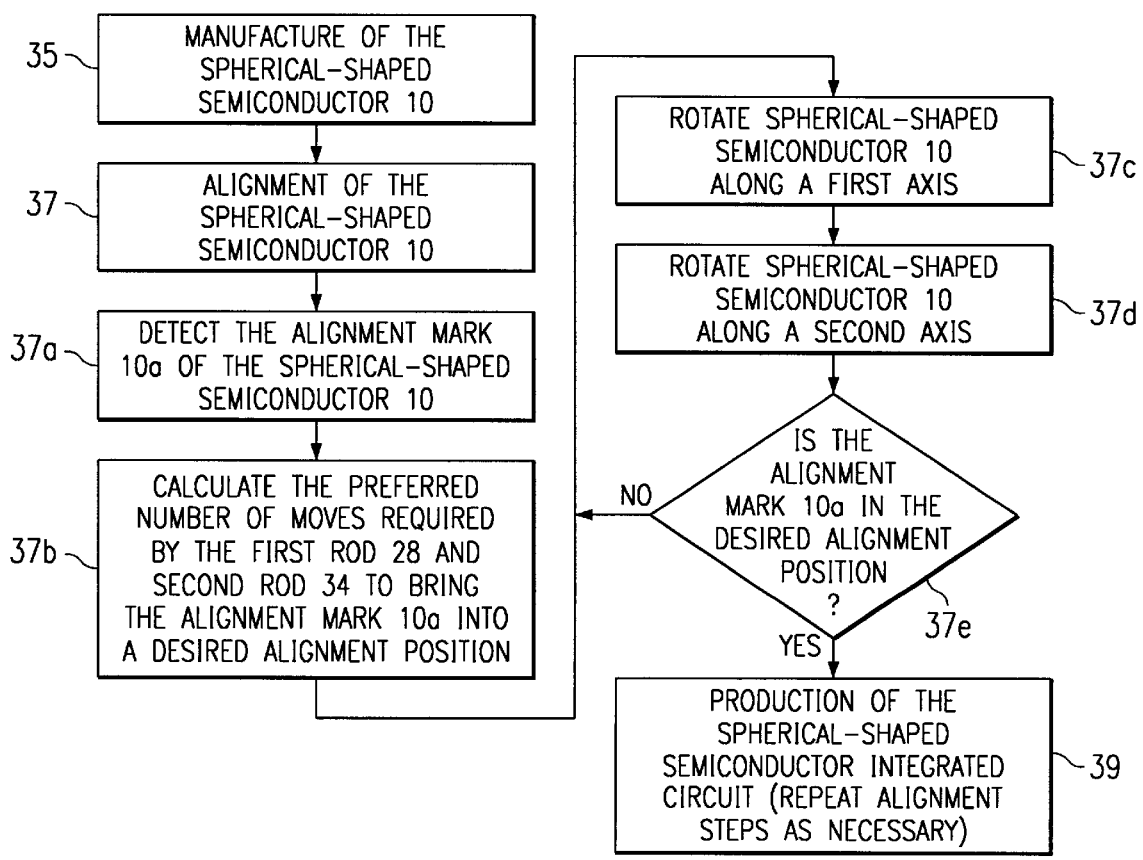
FIG. 3 depicts a flow chart of the alignment process.

Referring to FIG. 3, an overview of the spherical-shaped semiconductor production process is represented as a flow chart. In step 35, the spherical-shaped semiconductor 10 is manufactured, and the alignment mark 10a is affixed.

Step 37 represents the alignment of the spherical-shaped semiconductor 10 by the above-described controller, comprising a series of steps 37a–37e. It is understood that at the beginning of step 37, the spherical-shaped semiconductor 10 is placed in the section 26a of the housing 24 by any non-scratching means, such as a vacuum applied to a tube. As a result of this initial placement, the alignment mark 10a will be in a random position.

In step 37a, the micro lens (coupled with an optical sensing system) conveys the position of the alignment mark 10a. It is understood that to accomplish this, the spherical-shaped semiconductor 10 may have to be rotated either equatorially, or longitudinally, or in some combination thereof, until the mark 10a can be brought into the lens' view, as the spherical shape of the spherical-shaped semiconductor 10 conceals at least one half of its surface area from the micro lens.

In step 37b, the controller's software analyzes the initial position of the alignment mark 10a, and calculates the preferred number of equatorial moves (produced by the first rod 28) and longitudinal moves (produced by the second rod 34) to bring the alignment mark 10a into the desired alignment position. It is understood that the number of moves is entirely dependent on the initial position of the alignment mark 10a. For example, one scenario might be that the spherical-shaped semiconductor 10 should be rotated equatorially right 30 degrees, and then longitudinally up 60 degrees relative to the initial position of the alignment mark. As will be explained, considerations arising from the type of rod actuator system may make other solutions more desirable; for example, reversing the order of rotation, or reversing the direction of rotation.

In step 37c, the vacuum and actuator associated with the first rod 28 are activated and the rod is rotated to produce a corresponding rotation of the temporarily coupled spherical-shaped semiconductor 10 (and consequently the mark 10a) 30 degrees to the right. At this point, the actuator is deactivated, stopping rotation. Next, in step 37d, the vacuum and actuator associated with the second rod 34 are activated, simultaneously deactivating the first rod's vacuum, to produce a corresponding rotation of the spherical-shaped semiconductor 10 (and consequently the mark 10a) 60 degrees upward.

In step 37e, it is determined by the above-described controller whether the alignment mark is in the desired alignment position. If not, the alignment steps, including equatorial rotation and/or longitudinal rotation, are repeated as necessary. On the other hand, if the alignment mark 10a is in the desired alignment position, the spherical-shaped semiconductor 10 proceeds to step 39, production. Also, realigning the spherical-shaped semiconductor 10 during production may be necessary, and if so, the alignment steps 37a–37e are repeated.

Figure 4:
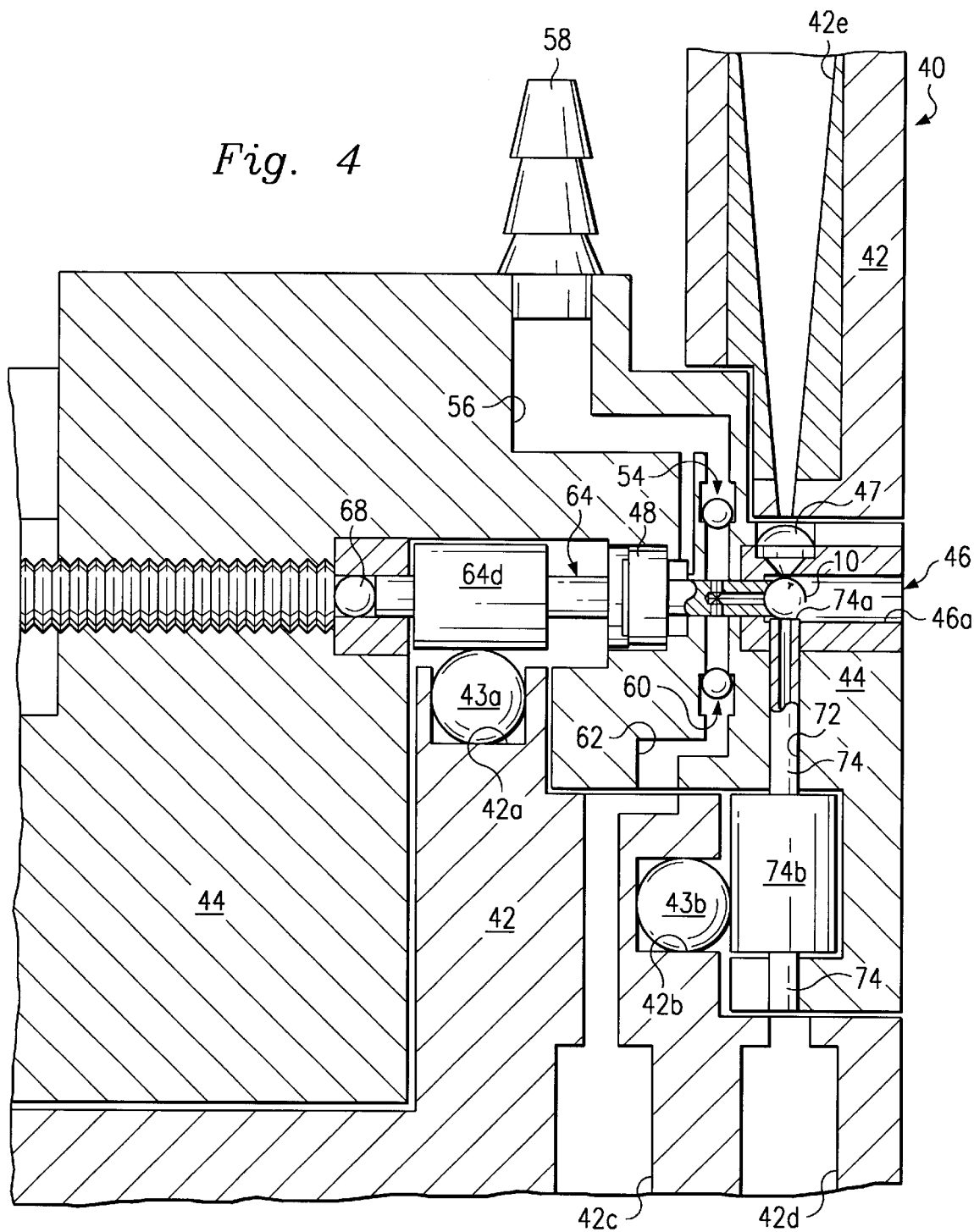
FIG. 4 illustrates a cross sectional view of an embodiment of an apparatus for aligning a spherical-shaped semiconductor.
Figure 5:
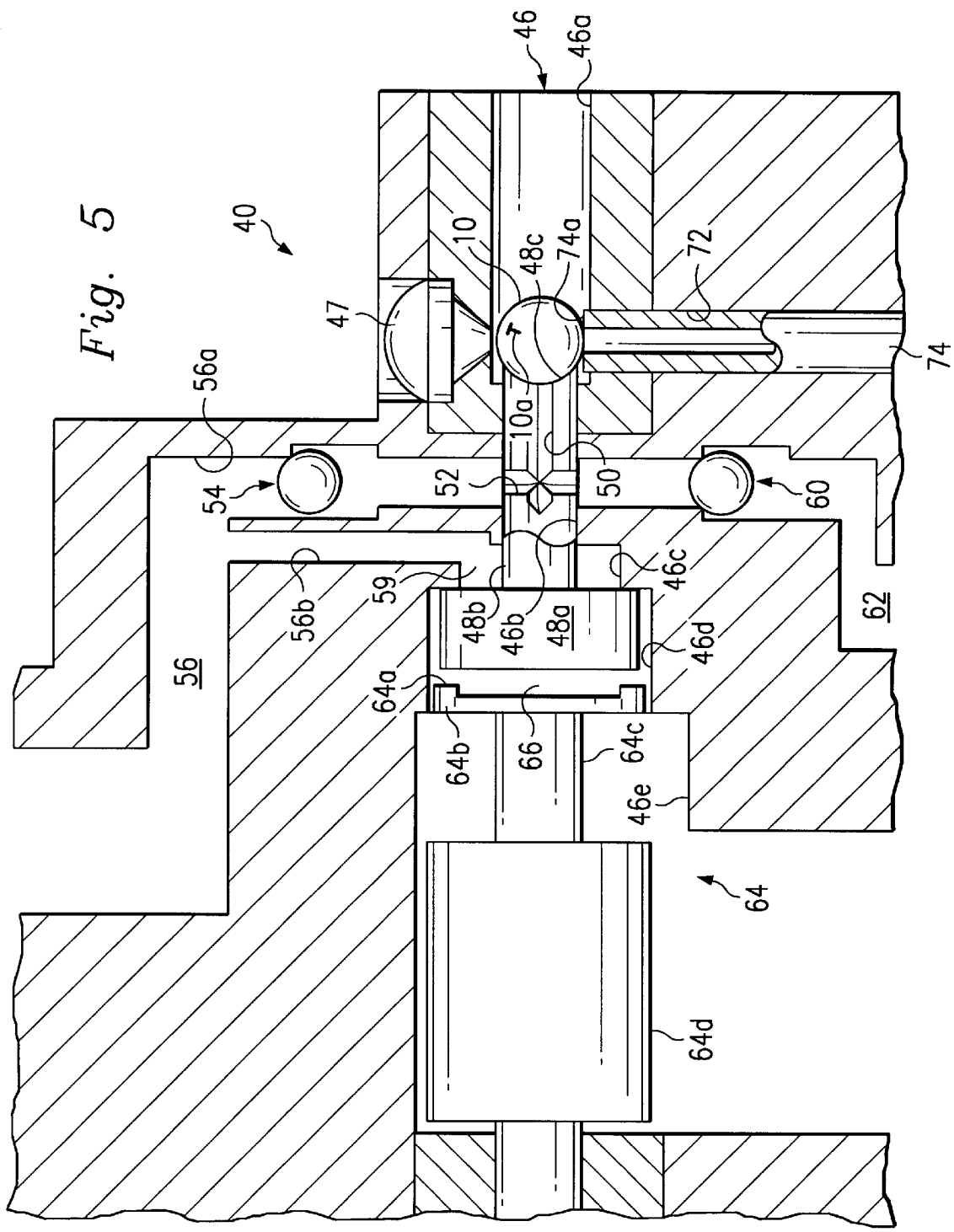
FIG. 5 depicts an enlarged cross sectional view of the embodiment of FIG. 4.

Referring to FIGS. 4 and 5, the reference numeral 40 refers to an embodiment of an apparatus for aligning the spherical-shaped semiconductor 10, having a rotational actuator. The device 40 has a fixed housing portion 42 having first and second grooves 42a and 42b, for receiving rubber inserts 43a and 43b, respectively. A pair of stepped bores 42c and 42d, and a tapered bore 42e, are disposed in the fixed housing portion 42, for reasons to be described.

A rotatable housing portion 44 is disposed in the device 40 adjacent to the fixed housing portion 42. It is understood that the terms fixed and rotatable pertain to the environment of the apparatus, as will be explained in detail. A motor (not shown) is provided for rotating the rotatable housing 44.

The rotatable housing 44 has a bore 46, which is stepped along its length to form sections: 46a, 46b, 46c, 46d, and 46e, respectively. The section 46a receives the spherical-shaped semiconductor 10 for alignment. A micro lens 47 is disposed adjacent to the section 46a, for conveying an image of the spherical-shaped semiconductor 10 through the tapered bore 42e to an optical sensing system of the controller.

A substantially "T"-shaped pedestal 48 is disposed in the rotatable housing 44, and is capable of both axial and rotational movement along its longitudinal axis. The pedestal 48 has a circular flared portion 48a, with a narrow leg 48b extending from the flared portion 48a, terminating in an end 48c. The flared portion 48a is disposed in the section 46d, and the end 48c protrudes into the section 46a to contact the spherical-shaped semiconductor 10. An axial bore 50, and a communicating cross bore 52 are formed in the leg 48b for reasons to be described.

A first ball valve 54 is disposed in the rotatable housing 44 in communication with one end of the cross bore 52. A passage 56 connects the ball valve 54 to a vacuum line nozzle 58, which is operably attached to a device for producing a vacuum and an air burst (not shown). The passage 56 is bifurcated to form portions 56a and 56b, the latter for connecting the vacuum line nozzle 58 to a chamber 59, defined between opposing surfaces of the section 46c of the rotatable housing 44 and the pedestal 48.

A second ball valve 60 is disposed in the rotatable housing 44 opposite the first ball valve 54, and also in communication with the pedestal cross bore 52. A passage 62 is disposed in the rotatable housing 44 to connect with the fixed housing bore 42c, which is operably connected to a device for producing a vacuum (not shown).

An actuator base 64 is disposed in the rotatable housing 44 to be selectively engaged by the pedestal 48 in a manner to be described. The base 64 comprises a ridge 64a, a body 64b, a column 64c, and a roller sleeve 64d, extending over a portion of the column 64c. In a first position (not shown), the ridge 64a is in contact with the pedestal flared portion 48a. In a second position, a clearance 66 is formed between the ridge 64a and the flared portion 48a, in a manner to be explained. A thrust bearing 68 is disposed below the column 64c for adjusting the position of the base 64, and therefore the width of the clearance 66. The roller sleeve 64d of the base 64 contacts the rubber insert 43a disposed in the fixed housing 42.

A second bore 72 is formed in the rotatable housing 44, perpendicular to the bore 46, and receives a rod 74. The rod 74 is straight and hollow, and held in the bore 72 in a manner that allows the rod 74 to freely rotate along its longitudinal axis. A first end 74a of the rod 74 protrudes slightly into section 46a to removably contact the spherical-shaped semiconductor 10, and a roller sleeve 74b extends over a distal portion of the rod 74, to contact the rubber insert 43b disposed in the fixed housing 42. It is understood that a device for producing a vacuum is operably attached to the interior of the rod 74 via bore 42d of the fixed housing 42.

Figure 6:
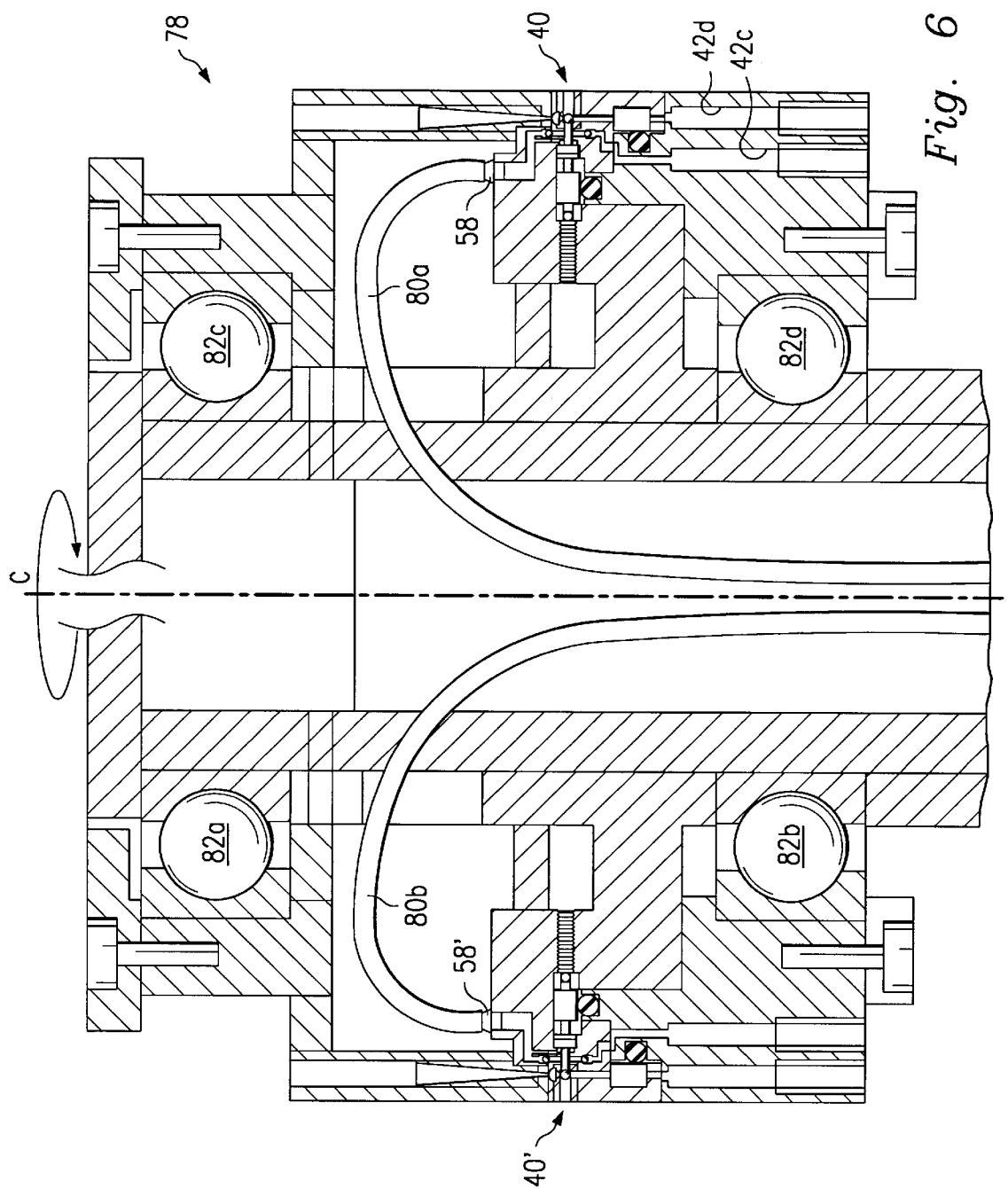
FIG. 6 depicts a cross sectional view of a device for housing a plurality of the devices of FIG. 4.

Referring to FIG. 6, a device, generally referred to by the reference numeral 78, is shown for retaining the alignment device 40. A second alignment device 40', which is identical to the device 40, is also disposed in the device 78, and it is understood that the device 78 may house at least 90 devices substantially similar to the device 40. A vacuum line 80a is attached to the nozzle 58, and another vacuum line 80b is attached to a nozzle 58' of the device 40', for operably attaching the devices 40 and 40' respectively to vacuum producing devices. Other vacuum lines for connecting the bores 42c and 42d to respective vacuum producing devices are understood.

Bearings 82a–82d allow a portion of the device 78, corresponding to the above-described rotatable housing 44, to rotate, as indicated by the reference arrow C.

In operation, the device 40 responds to three commands sent from the above-described controller to align the spherical-shaped semiconductor 10: STOP, First-axis Rotation, and Second-axis Rotation, in a manner to be described. The spherical-shaped semiconductor 10 is placed in the section 46a of the rotatable housing 44 by any non-scratching means, such as by suction applied to a tube (not shown). The micro lens 47 conveys the position of the alignment mark 10a of the controller. It is understood that to observe the alignment mark, the spherical-shaped semiconductor 10 may have to be rotated either equatorially, or longitudinally, or in some combination thereof. Software associated with the controller analyzes the initial position of the alignment mark 10a, and calculates the preferred number of equatorial and longitudinal moves to bring the alignment mark 10a into the desired alignment position.

Receiving the STOP command activates the vacuum device associated with the ball valve 54, and thus decreased pressure is carried through the nozzle 58 and the passage 56. Decreased pressure passing through the passage portion 56a opens the ball valve 54 (as illustrated), and flows through the pedestal cross bore 52, thereby closing the ball valve 60. It is understood that, as such, the ball valves 54 and 60 are reciprocally paired, i.e., when one is open, the other is shut. Decreased pressure is also carried through the pedestal axial bore 50 via the cross bore 52, causing the spherical-shaped semiconductor 10 to be coupled to the pedestal end 48c. The decreased pressure passing through the passage portion 56b is conveyed to chamber 59, causing the pedestal 48 to draw up in response to the decreased pressure, thereby forming the clearance 66 between the pedestal and the base 64. Thus, the spherical-shaped semiconductor 10 is held to the pedestal 48, but not rotating.

Upon receiving the First-axis Rotation command, a burst of air is forced through the nozzle 58 and the passage 56. The increased pressure passing through the passage portion 56a closes the ball valve 54. Simultaneously, the vacuum device associated with the ball valve 60 is activated, and thus decreased pressure is carried through the bore 42c and the passage 62, opening the ball valve 60. Decreased pressure is thereby carried through the pedestal axial bore 50 via the cross bore 52, causing the spherical-shaped semiconductor 10 to remain coupled to the pedestal end 48c.

The increased pressure passing through passage portion 56b is conveyed to chamber 59, and the increasing pressure therein forces the pedestal flared portion 48a towards, and into frictional engagement with, the base ridge 64a. As the rotatable housing 44 turns, the roller sleeve 64d frictionally engages the rubber insert 43a, causing a corresponding rotation of the base 64. Thus, if the housing is rotating, the base 64, the pedestal 48, and the spherical-shaped semiconductor 10 rotate together along a first axis. After the desired rotation of the spherical-shaped semiconductor 10 is achieved, another STOP command is given by the controller, as described above, and the pedestal 48 is disengaged from the base 64.

Receiving the Second-axis Rotation command activates the vacuum device associated with the rod 74, and turns off the vacuum associated with ball valve 54. The former causes decreased pressure to be carried through the bore 42d and rod 74, causing the spherical-shaped semiconductor 10 to be coupled to the rod end 74a.

As the rotatable housing 44 turns, the rod's roller sleeve 74b frictionally engages the rubber insert 43b, causing a corresponding rotation of the rod 74. Thus, the rod 74, and the spherical-shaped semiconductor 10 rotate together along a second axis. After the desired rotation of the spherical-shaped semiconductor 10 is achieved, another STOP command is given by the controller, as described above.

Although many rotational solution sets are possible to align the spherical-shaped semiconductor 10, one major consideration is the direction of movement for the rotatable housing 44. For example, if the rotatable housing 44 is moving in a direction that produces left rotation, the above-described controller should plot a solution involving left rotation, instead of attempting to reverse the rotational direction of the rotatable housing 44. As with any manufacturing process, saving time is of considerable importance.

One advantage of this embodiment is that the spherical-shaped semiconductor can be rotated along two axes with great accuracy. Another advantage of the embodiment described herein is that the spherical-shaped semiconductor can be aligned without being grasped and thereby potentially damaged.

Figure 7:
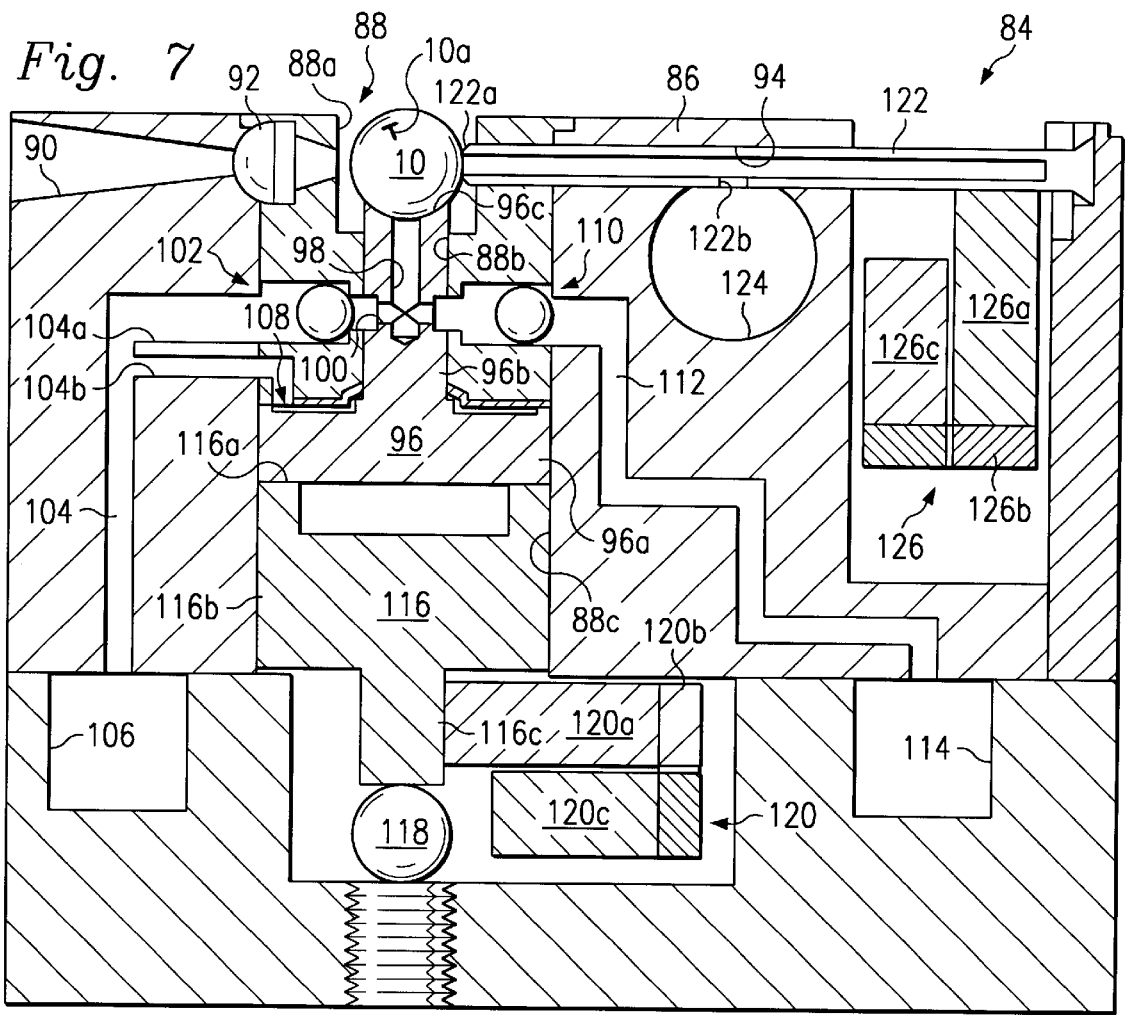
FIG. 7 depicts a cross sectional view of yet another embodiment of an apparatus for aligning a spherical-shaped semiconductor.

Referring to FIG. 7, the reference numeral 84 refers to an embodiment of an apparatus for aligning the spherical-shaped semiconductor 10, having a linear actuator. The apparatus 84 has a housing 86, and a plurality of bores 88 are formed in the housing 86 to accommodate a plurality of spherical-shaped semiconductors 10, each bore being stepped along its length to form sections: 88a, 88b, and 88c, respectively. The housing bore section 88a receives the spherical-shaped semiconductor 10 for alignment, as will be described.

A second bore 90 is formed in the housing 86, opening into the section 88a. The bore 90 receives a micro lens 92, for conveying an image of the spherical-shaped semiconductor 10 to an optical sensing system of the controller.

A third bore 94 is formed in the housing 86, and also opens into the section 88a for reasons to be described.

A substantially "T"-shaped pedestal 96 is disposed in the housing 86, and is capable of both axial and rotational movement along its longitudinal axis. The pedestal 96 has a circular flared portion 96a, with a narrow leg 96b extending from the flared portion 96a, terminating in an end 96c. The flared portion 96a is disposed in the section 88c, and the end 96c protrudes into the section 88a to contact the spherical-shaped semiconductor 10. An axial bore 98, and a communicating cross bore 100 are formed in the leg 96b for reasons to be described.

A first ball valve 102 is disposed in the housing 86 in communication with one end of the cross bore 100. A passage 104 connects the ball valve 102 to a vacuum line 106, which is operably attached to a device for producing a vacuum and an air burst (not shown). The passage 104 is bifurcated to form portions 104a and 104b, the latter for connecting the vacuum line 106 to a chamber 108, defined between opposing surfaces of the section 88c and the pedestal 96.

A second ball valve 110 is disposed in the housing 86 opposite the first ball valve 102, and also in communication with the pedestal cross bore 100. A passage 112 is disposed in the housing 86 to connect with a vacuum line 114, which is operably connected to a device for producing a vacuum (not shown).

An actuator base 116 is disposed in the housing 86 to be selectively engaged by the pedestal 96 in a manner to be described. The base 116 comprises a ridge 116a, a body 116b, and a column 116c. In a first position, the ridge 116a is in contact with the pedestal flared portion 96a. In a second position, a clearance (not shown) is formed between the ridge 116a and the flared portion 96a, in a manner to be explained. A thrust bearing 118 is disposed below the column 116c for adjusting the position of the base 116, and therefore the width of the clearance.

Figure 8:
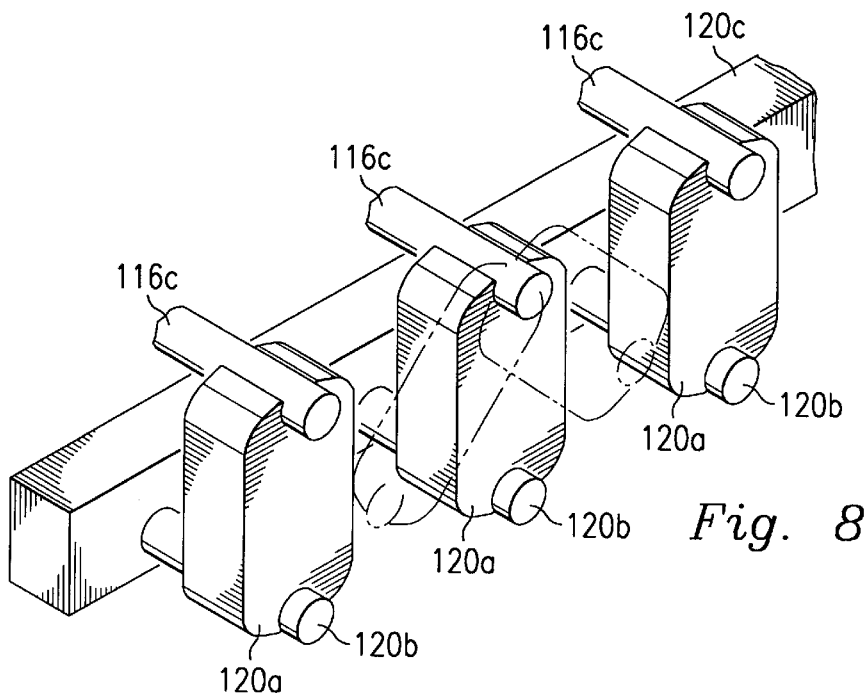
FIG. 8 illustrates an isometric view of the actuating means for the embodiment of FIG. 7.

An actuator, generally referred to by the reference numeral 120, is disposed in the housing 86. The actuator comprises a flag 120a coupled at one end to the column 116c of the base 116, and at the other end to a pin 120b, which is coupled to a link 120c, and thereby to a motor (not shown). Referring now to FIG. 8, the link 120c runs the length of the housing 86, and is operably attached to the motor to provide reciprocating linear movement. The link 120c has a limited range of linear movement, as indicated in phantom, and therefore produces rotation of the column 116c of only about 45 degrees in either direction.

Returning to FIG. 7, a straight and hollow rod 122 is disposed in the third housing bore 94, perpendicular to the pedestal 96. The rod 122 is held in the bore 94 in a manner that allows the rod to freely rotate along its longitudinal axis, as will be described. A first end 122a of the rod 122 protrudes slightly into section 88a to removably contact the spherical-shaped semiconductor 10. An opening 122b of the rod 122 connects the interior of the rod to a vacuum line 124 disposed in the housing 86. It is understood that a device for producing a vacuum is operably attached to the vacuum line 124.

A second actuator, generally referred to by the reference numeral 126, is disposed in the housing 86. The actuator 126 is substantially the same as actuator 120, and comprises a flag 126a coupled at one end to the rod 122, and at the other end to a pin 126b, which is coupled to a link 126c, and thereby to a motor (not shown). It is understood that the link 126c runs the length of the housing 86, and is operably attached to the motor to provide reciprocating linear movement. The link 126c has a limited range of linear movement, and thus, when the link's linear movement is translated into rotational movement by the pin 126b and flag 126a, the rod 122 can only rotate about 45 degrees in either direction.

In operation, the device 84 responds to three commands sent from a controller to align the spherical-shaped semiconductor 10: STOP, First-axis Rotation, and Second-axis Rotation, in a manner to be described. The spherical-shaped semiconductor 10 is placed in the section 88a of the housing 86 by any non-scratching means, such as by suction applied to a tube (not shown). The micro lens 92 conveys the position of the alignment mark 10a to the controller. Software associated with the above-described controller analyzes the initial position of the alignment mark 10a, and calculates the preferred number of equatorial and longitudinal moves to bring the alignment mark 10a into the desired alignment position.

Receiving the STOP command activates the vacuum device associated with the vacuum line 106 and the ball valve 102, and thus decreased pressure is carried through the passage 104. Decreased pressure passing through the passage portion 104a opens the ball valve 102, and flows through the pedestal cross bore 100, thereby closing the ball valve 110. It is understood that, as such, the ball valves 102 and 110 are reciprocally paired, i.e., when one is open, the other is shut. Decreased pressure is also carried through the pedestal axial bore 98 via the cross bore 100, causing the spherical-shaped semiconductor 10 to be coupled to the pedestal end 96c.

The decreased pressure passing through the passage portion 104b is conveyed to chamber 108, thereby causing the pedestal 96 to draw up, and thus forming a clearance (not shown) between the pedestal and base 116. Thus, the spherical-shaped semiconductor 10 is held to the pedestal 96, but not rotating.

Upon receiving the First-axis Rotation command, a burst of air is forced through the vacuum line 106 and the passage 104. The increased pressure passing through the passage portion 104a closes the ball valve 102. Simultaneously, the vacuum device associated with the vacuum line 114 is activated, and thus decreased pressure is carried through the passage 112, opening the ball valve 110. Decreased pressure is carried through the pedestal axial bore 98 via the cross bore 100, causing the spherical-shaped semiconductor 10 to remain coupled to the pedestal end 96c.

The increased pressure from the air burst in vacuum line 106 passes through passage portion 104b and is conveyed to chamber 108, and the increasing pressure therein forces the pedestal flared portion 96a into frictional engagement with the base ridge 116a. The base 116 rotates back and forth constantly between a position approximately 45 degrees to the right and approximately 45 degrees to the left of a center position, as a result of being connected to the actuator assembly 120. Thus, the base 116, the pedestal 96, and the spherical-shaped semiconductor 10 rotate together along a first axis. After the desired rotation of the spherical-shaped semiconductor 10 is achieved, another STOP command is given by the controller, as described above, and the pedestal 96 is disengaged from the base 116.

Receiving the Second-axis Rotation command activates the vacuum device associated with the vacuum line 124, and turns off the vacuum associated with vacuum line 106, and thus decreased pressure is carried through the opening 122b and the rod 122, causing the spherical-shaped semiconductor 10 to be coupled to the rod end 122a. The rod 122 rotates back and forth constantly between a position approximately 45 degrees to the right and approximately 45 degrees to the left of a center position, as a result of being connected to the actuator assembly 126. Thus, the rod 122 and the spherical-shaped semiconductor 10 rotate together along a second axis. After the desired rotation of the spherical-shaped semiconductor 10 is achieved, another STOP command is given by the controller, as described above.

Although many rotational solutions could align the spherical-shaped semiconductor 10, one major consideration is the direction of rotation produced by the actuators 120 and 126. For example, if the actuator is currently moving in a direction that produces left rotation, the controller should plot a solution involving left rotation, rather than waiting for the selected actuator's link to finish its leftward lateral movement and reverse to produce rightward motion. Similarly, engaging the spherical-shaped semiconductor 10 and causing it to "ride" the pedestal or rod until the net desired rotation is produced by its associated actuator 120 or 126, respectively, is undesirable because, as with any manufacturing process, saving time is of considerable importance.

One advantage of this embodiment is that the spherical-shaped semiconductor can be rotated along two axes with great accuracy. Another advantage of the embodiment described herein is that the spherical-shaped semiconductor can be aligned without being grasped and thereby potentially damaged.

Figure 9:
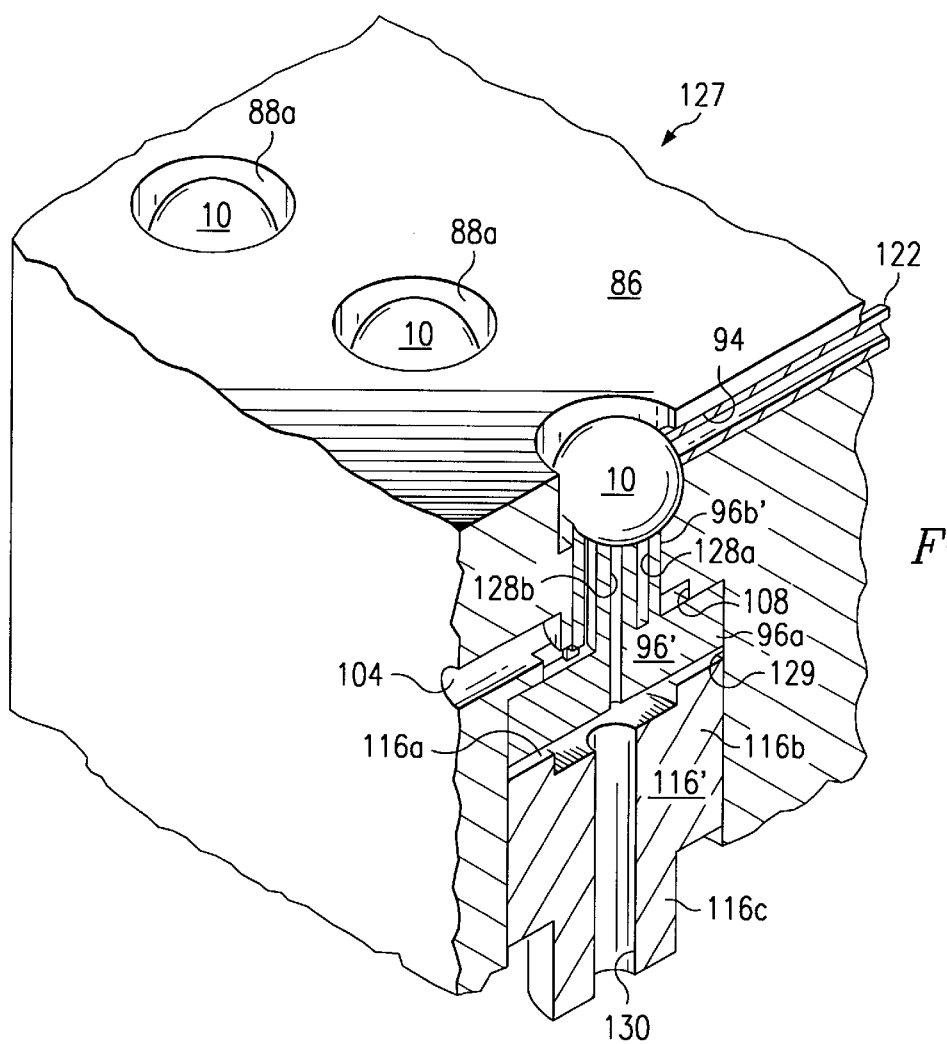
FIG. 9 depicts an isometric view, with a cross section, of another embodiment of an apparatus for aligning a spherical-shaped semiconductor.

FIG. 9 depicts an embodiment of the invention, generally referred to by the reference numeral 127, which is formed and operated in a manner substantially similar to the preceding embodiment of FIG. 7, and thus the same reference numerals are used for common elements. It is understood that some components, such as the vacuum lines, micro lens, and actuators are part of the invention, but are removed for clarity of the illustration.

The apparatus 127 has a housing 86, and a plurality of stepped bores 88 are formed in the housing 86 to accommodate a plurality of spherical-shaped semiconductors 10, each bore being stepped along its length to form sections: 88a, 88b, and 88c, respectively. The housing bore section 88a receives the spherical-shaped semiconductor 10 for alignment. A second bore 90 is formed in the housing 86, opening into the section 88a. The bore 90 receives a micro lens (not shown), for conveying an image of the spherical-shaped semiconductor 10 to an optical sensing system of the controller. A third bore 94 is formed in the housing 86, and also opens into the section 88a.

A substantially "T"-shaped pedestal 96' is disposed in the housing 86, and is capable of both axial and rotational movement along its longitudinal axis. The pedestal 96' has a circular flared portion 96a, with a narrow leg 96b' extending from the flared portion. A pair of parallel axial bores, 128a and 128b, are formed in the narrow leg 96b', for reasons to be described. The bores 128a and 128b are isolated from each other, but are in communication with the spherical-shaped semiconductor 10 at a first end of the pedestal 96'.

A passage 104 connects the pedestal bore 128a to a vacuum line (not shown), which is operably attached to a device for producing a vacuum. The passage 104 also communicates with a chamber 108 defined between the pedestal 96' and the housing 86.

The pedestal bore 128b passes completely through the pedestal 96', and into a chamber 129, formed between the housing 86, pedestal 96', and an actuator base 116', which is disposed in the housing 86 to be selectively engaged by the pedestal 96' in a manner to be described. The base 116' comprises a ridge 116a, a body 116b, a column 116c, and an axial bore 130.

In a first position (not shown), the ridge 116a is in contact with the pedestal flared portion 96a. In a second position, the chamber 129 is formed between the ridge 116a and the flared portion 96a, in a manner to be explained. A thrust bearing is disposed below the column 116c for adjusting the position of the base 116', and therefore the size of the chamber 129. The axial bore 130 is in communication with the chamber 129, and connected to a vacuum line which is operably connected to a device for producing a vacuum (not shown). It is understood that an actuator is provided for rotating the base 116'.

A straight and hollow rod 122 is disposed in the third housing bore 94, perpendicular to the pedestal 96'. The rod 122 is held in the bore 94 in a manner that allows the rod to freely rotate along its longitudinal axis, as will be described. A first end of the rod 122 protrudes slightly into section 88a to removably contact the spherical-shaped semiconductor 10, and a distal end of the rod is connected to an actuator and a device for producing a vacuum.

In operation, the device 127 responds to three commands sent from a controller to align the spherical-shaped semiconductor 10: STOP, First-axis Rotation, and Second-axis Rotation, in a manner to be described. The spherical-shaped semiconductor 10 is placed in the section 88a of the housing 86 by any non-scratching means, such as by suction applied to a tube (not shown). The micro lens conveys the position of the alignment mark 10a of the controller. Software associated with the above-described controller analyzes the initial position of the alignment mark 10a, and calculates the preferred number of equatorial and longitudinal moves to bring the alignment mark 10a into the desired alignment position.

Receiving the STOP command activates the vacuum device associated with the passage 104, and thus decreased pressure is carried through the passage 104 to the chamber 108 and bore 128a, the latter causing the spherical-shaped semiconductor 10 to be coupled to the pedestal end. The decreased pressure conveyed to chamber 108 causes the pedestal 96' to draw up, and thus forming a clearance (chamber 129) between the pedestal and base 116'. Thus, the spherical-shaped semiconductor 10 is held to the pedestal 96', but not rotating.

Upon receiving the First-axis Rotation command, the vacuum associated with the passage 104 is turned off, and simultaneously, the vacuum device associated with the base bore 130 is activated, and thus decreased pressure is carried through the bore 130, chamber 129, and pedestal bore 128b. Decreased pressure carried through the pedestal axial bore 128b causes the spherical-shaped semiconductor 10 to remain coupled to the pedestal end. The decreased pressure in chamber 129 draws the pedestal flared portion 96a into frictional engagement with the base ridge 116a. The base 116' rotates as a result of being connected to the actuator, and thus, the base 116', the pedestal 96', and the spherical-shaped semiconductor 10 rotate together along a first axis. After the desired rotation of the spherical-shaped semiconductor 10 is achieved, another STOP command is given by the controller, as described above, and the pedestal 96' is disengaged from the base 116'.

Receiving the Second-axis Rotation command activates the vacuum device associated with the rod 122, and shuts off the vacuum associated with the passage 104, causing the spherical-shaped semiconductor 10 to be coupled to the rod end 122a. The rod 122 rotates as a result of being connected to its associated actuator, and thus, the rod 122 and the spherical-shaped semiconductor 10 rotate together along a second axis. After the desired rotation of the spherical-shaped semiconductor 10 is achieved, another STOP command is given by the controller, as described above.

One advantage of this tube within a tube construction of the pedestal is that it allows the decreased pressures conveyed from the respective vacuum lines to be exposed to the spherical-shaped semiconductor 10 independently of one another without ball valves.

Figure 10:
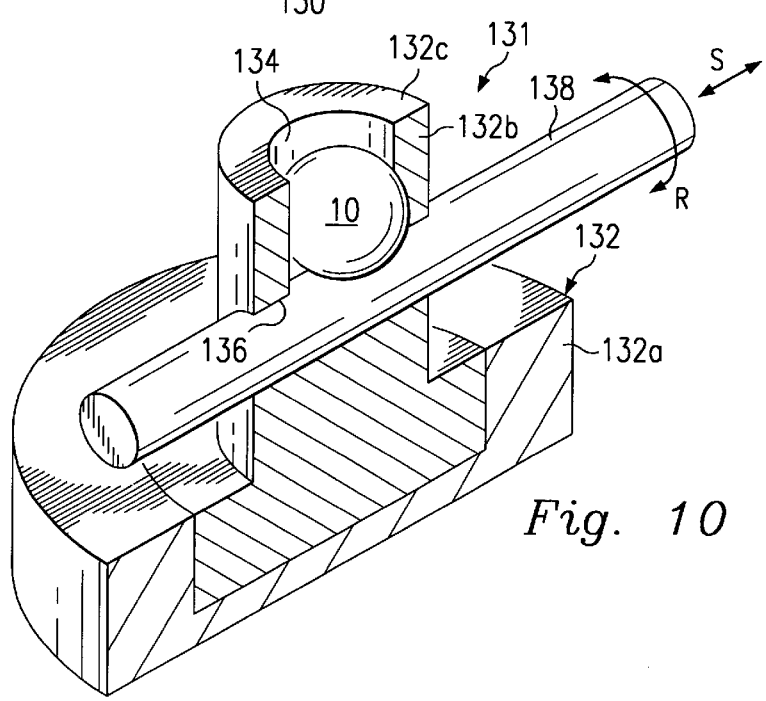
FIG. 10 illustrates yet another embodiment of an apparatus for manipulating a spherical-shaped semiconductor.

FIG. 10 depicts yet another embodiment of the invention for manipulating the spherical-shaped semiconductor 10, for example, for inspection of its surface or alignment. The embodiment, generally referred to by reference numeral 131, has a housing 132, made of metal or other suitable material. The housing 132 comprises a wide flange 132a, and a cylindrical column 132b rising perpendicularly from the flange, and terminating in a distal end 132c.

The column 132b has an axial bore 134. The axial bore 134 is large enough to permit insertion and removal of the spherical-shaped semiconductor 10. A gap is formed between the spherical-shaped semiconductor 10 and the sides of the column defining the bore 134, such that the spherical-shaped semiconductor is allowed to rotate freely in any direction.

The column 132b also has a radial through bore 136 for receiving a rod 138. The rod 138 frictionally engages the spherical-shaped semiconductor 10, and is attached to an actuator (not shown) for producing rotary movement, represented by reference numeral R, and axial movement, referred to by reference numeral S.

In operation, the spherical-shaped semiconductor 10 is placed in the bore 134, and touching the rod 138. Axial movement of the rod 138 produces longitudinal rotation of the spherical-shaped semiconductor in a left or right direction as viewed in FIG. 10. For example, if the rod moves axially to the left, the spherical-shaped semiconductor will rotate clockwise, or to the right as viewed. Rotational movement of the rod 102 produces longitudinal rotation of the spherical-shaped semiconductor in a front or back direction as viewed in FIG. 10; for example, if the rod rotates clockwise, the spherical-shaped semiconductor will rotate counterclockwise. Thus, by careful control of the rod's actuator, the spherical-shaped semiconductor can be rotated left, right, up, or down, and eventually, by using combinations of the aforesaid, into a desired position, assuming an alignment mark (not shown) is provided.

One advantage of this embodiment is that the spherical-shaped semiconductor can be manipulated without engaging the spherical-shaped semiconductor with vacuum rods, thereby simplifying manufacture.

It is understood that all spatial references are for the purpose of example only and are not meant to limit the invention. Furthermore, this disclosure shows and describes illustrative embodiments, however, the disclosure contemplates a wide range of modifications, changes, and substitutions. Such variations may employ only some features of the embodiments without departing from the scope of the underlying invention. For example, other means of actuation are possible. Accordingly, any appropriate construction of the claims will reflect the broad scope of the underlying invention.

What is claimed is:

1. A device for aligning a spherical-shaped semiconductor having an alignment mark, comprising:
    a housing having a bore for receiving the spherical-shaped semiconductor;
    means for conveying the position and orientation of the alignment mark to a controller; and
    means for rotating the spherical-shaped semiconductor along at least two axes thereof, thereby rotating the alignment mark into a predetermined orientation.

2. The device of claim 1 wherein the means for rotating the spherical-shaped semiconductor along at least two axes thereof is a rod frictionally engaged with the spherical-shaped semiconductor and capable of axial and rotary movement.

3. The device of claim 1 wherein the means for conveying the position and orientation of the alignment mark to a controller is a micro lens.

4. The device of claim 1 wherein the means for rotating the spherical-shaped semiconductor along at least two axes thereof is:
    a first rotatable rod disposed in the housing adjacent to the bore; and
    a second rotatable rod disposed in the housing adjacent to the bore and perpendicular to the first rod;
    wherein the rods operate by selectively and sequentially engaging the spherical-shaped semiconductor to impart rotation in a radial plane relative to the engaged rod.

5. The device of claim 4 wherein a first portion of the housing rotates relative to a second portion of the housing, and wherein the rods are actuated by cooperating rollers and frictional elements disposed on the respective portions of the housing.

6. The device of claim 5 wherein one of the rods comprises:
    a pedestal; and
    a base for being selectively engaged by the pedestal, wherein the pedestal is rotated only when engaged with the base.

7. The device of claim 4 wherein each rod is actuated by a linear actuator comprising:
   a flag coupled to the rod;
   a pin coupled to the flag;
   a link coupled to the pin, and thereby to the flag, wherein the link is attached to a motor for providing reciprocating linear movement to the link, which produces rotation of the rod.

8. The device of claim 7 wherein one of the rods comprises:
   a pedestal; and
   a base coupled to the flag for being selectively engaged by the pedestal, wherein the pedestal is rotated only when engaged with the base.

9. A device for aligning a spherical-shaped semiconductor having an alignment mark, comprising:
   a housing having a bore for receiving the spherical-shaped semiconductor;
   means for conveying the position and orientation of the alignment mark to a controller;
   a first rotatable rod disposed in the housing adjacent to the bore; and
   a second rotatable rod disposed in the housing adjacent to the bore and perpendicular to the first rod;
   wherein the rods operate by selectively and sequentially engaging the spherical-shaped semiconductor to impart rotation in a radial plane relative to the engaged rod, thereby rotating the alignment mark into a predetermined orientation.

10. The device of claim 9 wherein a first portion of the housing rotates relative to a second portion of the housing, and wherein the rods are actuated by cooperating rollers and frictional elements disposed on the respective portions of the housing.

11. The device of claim 10 wherein one of the rods comprises:
   a pedestal; and
   a base for being selectively engaged by the pedestal, wherein the pedestal is rotated only when engaged with the base.

12. The device of claim 9 wherein each rod is actuated by a linear actuator comprising:
   a flag coupled to the rod;
   a pin coupled to the flag;
   a link coupled to the pin, and thereby to the flag, wherein the link is attached to a motor for providing reciprocating linear movement to the line, which the link's reciprocating linear movement produces rotation of the rod.

13. The device of claim 12 wherein one of the rods comprises:
   a pedestal; and
   a base coupled to the flag for being selectively engaged by the pedestal, wherein the pedestal is rotated only when engaged with the base.

14. A device for aligning a spherical-shaped semiconductor having an alignment mark, comprising:
   a housing having a bore for receiving the spherical-shaped semiconductor;
   a micro lens adjacent to the bore for conveying the position and orientation of the alignment mark to a controller; and
   means for rotating the spherical-shaped semiconductor, thereby rotating the alignment mark into a predetermined orientation.

15. The device of claim 14, wherein the means for rotating the spherical-shaped semiconductor is:
   a first rotatable rod disposed in the housing adjacent to the bore; and
   a second rotatable rod disposed in the housing adjacent to the bore and perpendicular to the first rod;
   wherein the rods operate by selectively and sequentially engaging the spherical-shaped semiconductor to impart rotation in a radial plane relative to the engaged rod.

16. The device of claim 15, wherein the amount of rotation in the plane is proportional to the length of time the spherical-shaped semiconductor is engaged by the rod.

17. The device of claim 15, wherein the first and second rotatable rods are hollow.

18. The device of claim 17, wherein each of the first and second rotatable rods are attached to an associated vacuum source, such that engagement of the spherical-shaped semiconductor is accomplished by suction produced by the vacuum source.

19. The device of claim 14, wherein the means for rotating the spherical-shaped semiconductor is a rod disposed the housing for frictionally engaging, and thereby producing corresponding rotation of, the spherical-shaped semiconductor.

20. The device of claim 19, wherein axial movement of the rod produces rotation of the spherical-shaped semiconductor in a first plane, and rotational movement of the rod produces rotation of the spherical-shaped semiconductor in a second plane.

21. The device of claim 19, wherein the rod is disposed perpendicular to the bore and beneath the spherical-shaped semiconductor.

22. A device for aligning a spherical-shaped semiconductor having an alignment mark, comprising:
   a housing having a bore for receiving the spherical-shaped semiconductor;
   a micro lens adjacent to the bore for conveying the position and orientation of the alignment mark to a controller;
   a first rotatable rod disposed in the housing; and
   a second rotatable rod disposed in the housing;
   wherein the rods are activated to rotate the spherical-shaped semiconductor, and therefore the alignment mark, into a predetermined orientation by selectively and sequentially engaging the spherical-shaped semiconductor, the rotation of the spherical-shaped semiconductor being in a radial plane relative to the engaged rod.

23. The device of claim 22, wherein the amount of rotation in the plane is proportional to the length of time the spherical-shaped semiconductor is engaged by the engaged rod.

24. The device of claim 22, wherein the first and second rotatable rods are hollow.

25. The device of claim 24, wherein each of the first and second rotatable rods are attached to an associated vacuum source, such that engagement of the spherical-shaped semiconductor is accomplished by suction from the vacuum.

26. A device for aligning a spherical-shaped semiconductor, comprising:
   a housing having a bore for receiving the spherical-shaped semiconductor;
   means for sensing the orientation of the spherical-shaped semiconductor;
   a first hollow rod disposed in the housing;

a second hollow rod disposed in the housing substantially perpendicular to the first rod;

means for rotationally actuating the first and second rods;

means for producing a vacuum in a selected one of the first and second rods, wherein the vacuum causes the spherical-shaped semiconductor to be removably coupled to the selected rod;

wherein rotation of the selected rod imparts a corresponding rotation to the spherical-shaped semiconductor, such that by selectively and sequentially engaging the spherical-shaped semiconductor, the rods can rotate the spherical-shaped semiconductor to a predetermined orientation.

27. The device of claim 26, wherein the means for sensing the orientation of the spherical-shaped semiconductor comprises an alignment mark disposed on the spherical-shaped semiconductor, and a micro lens disposed adjacent to the spherical-shaped semiconductor and operatively connected to a controller.

28. The device of claim 26, wherein the means for rotationally actuating the each of the first and second rods comprises:

a flag connected to the rod;

a pin coupled to the flag;

a link coupled to the pin; and an actuator attached to the link for producing translational motion, wherein the pin and flag convert the translational motion of the link into rotational motion of the rod.

29. The device of claim 26, wherein the means for producing a vacuum in a selected one of the first and second rods comprises:

a first vacuum line connected to the first rod;

a second vacuum line connected to the second rod;

means for producing a vacuum associated with each vacuum line; and means for controlling which vacuum line is selected, thereby determining which rod engages the spherical-shaped semiconductor.

30. Apparatus for aligning a spherical-shaped object having an alignment mark, comprising:

a housing having a bore for receiving the spherical-shaped object;

a micro lens adjacent to the bore for sensing the position and orientation of the alignment mark;

a first rotatable rod disposed in the housing; and a second rotatable rod disposed in the housing;

wherein the rods are activated to rotate the spherical-shaped object, and therefore the alignment mark, into a predetermined orientation by selectively and sequentially engaging the spherical-shaped object, and wherein the amount of rotation in the plane is proportional to the length of time the spherical-shaped object is engaged by the engaged rod.

31. The device of claim 30, wherein the first and second rotatable rods are hollow, and each of the first and second rotatable rods are attached to an associated vacuum source, such that engagement of the spherical-shaped object is accomplished by suction produced by the vacuum.

* * * * *